United States Patent
Murakami et al.

(10) Patent No.: US 9,685,277 B2
(45) Date of Patent: *Jun. 20, 2017

(54) ELECTRODE

(71) Applicant: SEMICONDUCTOR ENERGY LABORATORY CO., LTD., Atsugi-shi, Kanagawa-ken (JP)

(72) Inventors: Satoshi Murakami, Kanagawa (JP); Kazutaka Kuriki, Kanagawa (JP); Mikio Yukawa, Kanagawa (JP)

(73) Assignee: Semiconductor Energy Laboratory Co., LTD., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/011,857

(22) Filed: Feb. 1, 2016

(65) Prior Publication Data

US 2016/0163470 A1  Jun. 9, 2016

Related U.S. Application Data

(63) Continuation of application No. 13/111,079, filed on May 19, 2011, now Pat. No. 9,281,134.

(30) Foreign Application Priority Data

Jun. 2, 2010 (JP) ................. 2010-126514

(51) Int. Cl.
*H01M 4/58* (2010.01)
*H01G 11/24* (2013.01)
(Continued)

(52) U.S. Cl.
CPC ............ *H01G 11/24* (2013.01); *C23C 16/24* (2013.01); *H01G 11/30* (2013.01); *H01G 11/46* (2013.01);
(Continued)

(58) Field of Classification Search
CPC .. H01M 4/0428; H01M 4/134; H01M 4/1395; H01M 4/48; H01M 4/52;
(Continued)

(56) References Cited

U.S. PATENT DOCUMENTS 3,796,598 A  3/1974 Gejyo et al.
4,155,781 A  5/1979 Diepers
(Continued)

FOREIGN PATENT DOCUMENTS

CN  001476645 A  2/2004
CN  102460782 A  5/2012
(Continued)

OTHER PUBLICATIONS

International Search Report (Application No. PCT/JP2011/061128) Dated Aug. 9, 2011.
(Continued)

*Primary Examiner* — Raymond Alejandro
(74) *Attorney, Agent, or Firm* — Nixon Peabody LLP; Jeffrey L. Costellia

(57) ABSTRACT

An electrode which can have an improved performance such as higher discharge capacity and in which deterioration due to peeling of an active material layer or the like is difficult to occur are provided. The electrode includes an active material layer including a first protrusion, a second protrusion and a continuous active material film, a metal oxide layer, and a continuous mixed layer. The first protrusion, the second protrusion and the continuous active material film includes silicon. The metal oxide layer includes oxygen and a metal element which is capable of forming silicide by reacting with silicon. The continuous mixed layer includes silicon and the metal element.

20 Claims, 11 Drawing Sheets

(51) Int. Cl.
  *C23C 16/24* (2006.01)
  *H01G 11/30* (2013.01)
  *H01M 4/04* (2006.01)
  *H01M 4/134* (2010.01)
  *H01M 4/1395* (2010.01)
  *H01M 4/66* (2006.01)
  *H01G 11/46* (2013.01)
  *H01M 4/48* (2010.01)
  *H01M 4/52* (2010.01)
  *H01M 10/0525* (2010.01)

(52) U.S. Cl.
  CPC ......... *H01M 4/0428* (2013.01); *H01M 4/134* (2013.01); *H01M 4/1395* (2013.01); *H01M 4/48* (2013.01); *H01M 4/52* (2013.01); *H01M 4/661* (2013.01); *H01M 10/0525* (2013.01); *H01M 2220/20* (2013.01); *H01M 2220/30* (2013.01); *Y02E 60/122* (2013.01); *Y02E 60/13* (2013.01); *Y02P 70/54* (2015.11); *Y02T 10/7022* (2013.01); *Y10T 29/417* (2015.01); *Y10T 29/49115* (2015.01)

(58) Field of Classification Search
  CPC .. H01M 4/661; H01M 10/0525; H01G 11/24; H01G 11/30; H01G 11/46; C23C 16/24; Y02E 60/122; Y02E 60/13; Y02T 10/7022
  See application file for complete search history.

(56) References Cited

U.S. PATENT DOCUMENTS

| | | | |
|---|---|---|---|
| 5,338,625 A | 8/1994 | Bates et al. | |
| 6,451,113 B1 | 9/2002 | Givargizov | |
| 6,685,804 B1 | 2/2004 | Ikeda et al. | |
| 6,844,113 B2 | 1/2005 | Yagi et al. | |
| 6,887,511 B1 | 5/2005 | Shima et al. | |
| 7,015,496 B2 | 3/2006 | Ohnuma et al. | |
| 7,160,646 B2 | 1/2007 | Ohshita et al. | |
| 7,192,673 B1 | 3/2007 | Ikeda et al. | |
| 7,235,330 B1 | 6/2007 | Fujimoto et al. | |
| 7,241,533 B1 | 7/2007 | Ikeda et al. | |
| 7,326,491 B2 | 2/2008 | Takahashi et al. | |
| 7,410,728 B1 | 8/2008 | Fujimoto et al. | |
| 7,691,533 B2 | 4/2010 | Sano et al. | |
| 7,794,881 B1 | 9/2010 | Fujimoto et al. | |
| 8,257,866 B2 | 9/2012 | Loveness et al. | |
| 8,304,105 B2 | 11/2012 | Kang et al. | |
| 8,450,012 B2 | 5/2013 | Cui et al. | |
| 8,556,996 B2 | 10/2013 | Loveness et al. | |
| 8,586,918 B2 | 11/2013 | Brucker et al. | |
| 9,281,134 B2 * | 3/2016 | Murakami | C23C 16/24 |
| 2005/0079421 A1 | 4/2005 | Konishiike et al. | |
| 2005/0191547 A1 | 9/2005 | Konishiike et al. | |
| 2005/0244324 A1 | 11/2005 | Hatta et al. | |
| 2007/0007239 A1 * | 1/2007 | Lee | H01M 4/0421 216/13 |
| 2007/0166613 A1 | 7/2007 | Kogetsu et al. | |
| 2008/0020281 A1 | 1/2008 | Kogetsu et al. | |
| 2008/0233478 A1 | 9/2008 | Hirose et al. | |
| 2008/0261112 A1 | 10/2008 | Nagata et al. | |
| 2009/0050204 A1 | 2/2009 | Habib | |
| 2009/0117462 A1 | 5/2009 | Okazaki et al. | |
| 2009/0136847 A1 | 5/2009 | Jeong et al. | |
| 2009/0214944 A1 | 8/2009 | Rojeski | |
| 2009/0317726 A1 | 12/2009 | Hirose et al. | |
| 2010/0086837 A1 | 4/2010 | Asari et al. | |
| 2010/0151322 A1 | 6/2010 | Sato et al. | |
| 2010/0178564 A1 | 7/2010 | Asari et al. | |
| 2010/0209784 A1 | 8/2010 | Yamazaki et al. | |
| 2010/0266898 A1 | 10/2010 | Yamamoto et al. | |
| 2010/0285358 A1 | 11/2010 | Cui et al. | |
| 2010/0330419 A1 | 12/2010 | Cui et al. | |
| 2010/0330421 A1 | 12/2010 | Cui et al. | |
| 2011/0027655 A1 | 2/2011 | Rojeski | |
| 2011/0151290 A1 | 6/2011 | Cui et al. | |
| 2011/0229761 A1 | 9/2011 | Cui et al. | |
| 2011/0236753 A1 * | 9/2011 | Kuriki | H01M 4/0428 429/218.1 |
| 2011/0266654 A1 | 11/2011 | Kuriki et al. | |
| 2011/0287318 A1 | 11/2011 | Loveness et al. | |
| 2011/0294005 A1 | 12/2011 | Kuriki et al. | |
| 2011/0294011 A1 | 12/2011 | Kuriki et al. | |
| 2011/0305950 A1 | 12/2011 | Kuriki et al. | |
| 2012/0003383 A1 | 1/2012 | Furuno | |
| 2012/0003807 A1 | 1/2012 | Furuno et al. | |
| 2012/0070741 A1 | 3/2012 | Liu et al. | |
| 2012/0183856 A1 | 7/2012 | Cui et al. | |
| 2012/0328962 A1 | 12/2012 | Takeuchi et al. | |
| 2013/0320582 A1 | 12/2013 | Cui et al. | |
| 2013/0344383 A1 | 12/2013 | Loveness et al. | |

FOREIGN PATENT DOCUMENTS

| | | |
|---|---|---|
| EP | 1562250 A | 8/2005 |
| EP | 1708214 A | 10/2006 |
| EP | 2427928 A | 3/2012 |
| JP | 2001-210315 A | 8/2001 |
| JP | 2002-083594 A | 3/2002 |
| JP | 2002-237294 A | 8/2002 |
| JP | 2003-077529 A | 3/2003 |
| JP | 2003-246700 A | 9/2003 |
| JP | 2003-303586 A | 10/2003 |
| JP | 2004-281317 A | 10/2004 |
| JP | 2007-294818 A | 11/2007 |
| JP | 2008-512838 | 4/2008 |
| JP | 2008-103118 A | 5/2008 |
| JP | 2008-269827 A | 11/2008 |
| JP | 2008-270154 A | 11/2008 |
| JP | 2009-134917 A | 6/2009 |
| JP | 2009-289586 A | 12/2009 |
| JP | 2010-262752 A | 11/2010 |
| JP | 2012-526362 | 10/2012 |
| JP | 2012-526364 | 10/2012 |
| KR | 2012-0024713 A | 3/2012 |
| TW | I249868 | 2/2006 |
| TW | 200610215 | 3/2006 |
| TW | I252603 | 4/2006 |
| TW | I256167 | 6/2006 |
| TW | I274432 | 2/2007 |
| TW | I294629 | 3/2008 |
| WO | WO-2005/050772 | 6/2005 |
| WO | WO-2006/028316 | 3/2006 |
| WO | WO-2009/108731 | 9/2009 |
| WO | WO-2010/129690 | 11/2010 |
| WO | WO-2010/129910 | 11/2010 |
| WO | WO-2010/138617 | 12/2010 |
| WO | WO-2010/138619 | 12/2010 |
| WO | WO-2011/109477 | 9/2011 |
| WO | WO-2011/119614 | 9/2011 |
| WO | WO-2011/149958 | 12/2011 |
| WO | WO-2012/054767 | 4/2012 |

OTHER PUBLICATIONS

Written Opinion (Application No. PCT/JP2011/061128) Dated Aug. 9, 2011.

Cui.L et al., "Crystalline-Amorphous Core-Shell Silicon Nanowires for High Capacity and High Current Battery Electrodes", NANO Letters, 2009, vol. 9, No. 1, pp. 491-495.

Kamins.T et al., "Ti-catalyzed Si nanowires by chemical vapor deposition: Microscopy and growth mechanisms", J. Appl. Phys. (Journal of Applied Physics), Jan. 15, 2001, vol. 89, No. 2, pp. 1008-1016.

Kohno.H et al., "Silicon Nanoneedies Grown by a Simple Thermal Treatment Using Metal-Sulfur Catalysts", Jpn. J. Appl. Phys. (Japanese Journal of Applied Physics), Feb. 1, 2002, vol. 41, No. 2A, pp. 577-578.

(56) References Cited

OTHER PUBLICATIONS

Chan.C et al., "High-performance lithium battery anodes using silicon nanowires", Nature Nanotechnology, Dec. 16, 2007, vol. 3, pp. 31-35.
Jung.H et al., "Amorphous silicon thin-film negative electrode prepared by low pressure chemical vapor deposition for lithium-ion batteries", Solid State Communications, Feb. 1, 2003, vol. 125, No. 7-8, pp. 387-390.
Chinese Office Action (Application No. 201180026957.8) Dated Oct. 29, 2014.
Taiwanese Office Action (Application No. 100119011) Dated Mar. 2, 2015.

* cited by examiner

ELECTRODE

TECHNICAL FIELD

The present invention relates to a power storage device and a method for manufacturing the power storage device.

Note that the power storage device refers to all elements and devices which have a function of storing electric power.

BACKGROUND ART

In recent years, power storage devices such as lithium ion secondary batteries, lithium ion capacitors, and air cells have been developed.

An electrode for a power storage device is manufactured by providing an active material over a surface of a current collector. As the active material, a material such as carbon or silicon, which can store and release ions serving as carriers, is used. For example, silicon or phosphorus-doped silicon has higher theoretical capacity than carbon and is advantageous in increasing the capacity of a power storage device (e.g., Patent Document 1).

REFERENCE

Patent Document

[Patent Document 1] Japanese Published Patent Application No. 2001-210315

DISCLOSURE OF INVENTION

However, even when silicon is used as a negative electrode active material, it is difficult to obtain discharge capacity that is as high as the theoretical capacity. In addition, in a power storage device using silicon as an active material, peeling of an active material layer or the like is caused in some cases. Thus, an object is to provide a power storage device which can have an improved performance such as higher discharge capacity, and a method for manufacturing the power storage device. Another object is to provide a power storage device in which deterioration of the power storage device due to peeling of an active material layer or the like is difficult to occur, and a method for manufacturing the power storage device.

One embodiment of the present invention is a power storage device including a current collector, a mixed layer formed over the current collector, and a crystalline silicon layer which is formed over the mixed layer and functions as an active material layer. The crystalline silicon layer includes a crystalline silicon region and a whisker-like crystalline silicon region including a plurality of protrusions projecting over the crystalline silicon region. The whisker-like crystalline silicon region includes a protrusion having a bending or branching portion.

The direction of extension (i.e., the direction of an axis) of the bending or branching portion is different from the direction of extension (i.e., the direction of an axis) of a protrusion serving as a base. The bending or branching portion extends from a side surface or a vicinity of a tip of the protrusion serving as the base. That is, a root of the bending or branching portion (a vicinity of an interface between the bending or branching portion and the protrusion serving as the base) exists on the side surface or in the vicinity of the tip of the protrusion serving as the base.

The protrusion having the bending or branching portion may have a portion which further bends or branches from the bending or branching portion.

A protrusion having a branching portion and a protrusion having a bending portion may coexist. Further, the protrusion having the branching portion may have a bending portion.

A protrusion included in the whisker-like crystalline silicon region may be in contact or intersect with another protrusion partly. Further, the protrusions may be joined at the portion where they are in contact or intersect with each other.

The protrusion having the bending or branching portion, which is included in the whisker-like crystalline silicon region, may be in contact or intersect with another protrusion partly. Further, the protrusion having the bending or branching portion, which is included in the whisker-like crystalline silicon region, may be in contact or intersect with another protrusion partly at the bending or branching portion. The protrusions may be joined at the portion where they are in contact or intersect with each other.

In the above structure, the whisker-like crystalline silicon region includes protrusions having a bending or branching portion; therefore, the protrusions can tangle, be in contact, or intersect with each other easily.

The whisker-like crystalline silicon region may include a protrusion which does not have a bending or branching portion (such a protrusion is also simply referred to as a protrusion). The protrusion having a bending or branching portion and the protrusion which does not have a bending or branching portion may coexist.

In the above structure, the directions of extension (i.e., the directions of axes) of the plurality of protrusions included in the whisker-like crystalline silicon region may be uneven (i.e., different directions). When the directions of extension (i.e., the directions of the axes) of the plurality of protrusions are uneven (i.e., different directions), the protrusions can tangle, be in contact, or intersect with each other easily. Alternatively, the directions of extension (i.e., the directions of the axes) of the plurality of protrusions in the whisker-like crystalline silicon region may be a normal direction to the current collector.

Since the crystalline silicon layer functioning as the active material layer includes the whisker-like crystalline silicon region, the surface area of the crystalline silicon layer is increased. When the surface area is increased, the rate at which a reaction substance (carrier ions such as lithium ions) in the power storage device is adsorbed to or absorbed by crystalline silicon or the rate at which the reaction substance is released from crystalline silicon becomes a higher rate per unit mass. When the rate at which the reaction substance is adsorbed or absorbed or the rate at which the reaction substance is released is increased, the amount of adsorption or absorption or the amount of release of the reaction substance at a high current density is increased; therefore, the discharge capacity or charge capacity of the power storage device can be increased.

Since the whisker-like crystalline silicon region includes the protrusions having a bending or branching portion, the protrusions can tangle, be in contact, or intersect with each other easily. Accordingly, the strength of the protrusions is increased (i.e., the protrusions are difficult to break) and deterioration of the power storage device due to peeling of the active material layer or the like can be suppressed.

Since the whisker-like crystalline silicon region includes the protrusions having a bending or branching portion, a decrease in the silicon density of the whisker-like crystalline silicon region can be suppressed. In particular, in the whisker-like crystalline silicon region, a decrease in the silicon density of a region which does not include a vicinity of a root of a protrusion (a vicinity of an interface between the protrusion and the crystalline silicon region) can be suppressed. Further, the amount of silicon can be increased in the whisker-like crystalline silicon region, and the surface area can be increased. In a power storage device manufactured using the crystalline silicon layer including the whisker-like crystalline silicon region, the energy density per unit volume of the power storage device can be improved.

For the current collector, a material with high conductivity, such as a metal element typified by platinum, aluminum, or copper, can be used. In addition, the current collector can be formed using a metal element that forms silicide by reacting with silicon.

The mixed layer includes silicon and a metal element. The mixed layer may include silicon and a metal element included in the current collector. In the case where the current collector is formed using a metal element that forms silicide by reacting with silicon, the mixed layer may be formed using silicide.

With the mixed layer between the current collector and the active material layer, a low-density region (a sparse region) is not formed between the current collector and the active material layer, so that interface characteristics between the current collector and the active material layer can be improved.

In addition, a metal oxide layer may be provided between the mixed layer and the active material layer. The metal oxide layer may be formed using an oxide of a metal element included in the current collector. Further, the metal oxide layer may be formed using an oxide semiconductor.

By formation of the metal oxide layer using an oxide semiconductor, resistance between the current collector and the active material layer can be reduced, and the discharge capacity or the charge capacity can be further increased as compared with those of the case where the metal oxide layer is formed using an insulator.

In the above structure, the crystalline silicon layer including the whisker-like crystalline silicon region can be formed over the current collector by a thermal chemical vapor deposition (also referred to as thermal CVD) method or a low pressure chemical vapor deposition (also referred to as LPCVD) method, by which heating is performed using a deposition gas including silicon. The whisker-like crystalline silicon region formed by the above method includes a plurality of protrusions which includes a protrusion having a bending or branching portion.

According to one embodiment of the present invention, a power storage device having an improved performance such as higher discharge capacity or charge capacity can be provided. A power storage device in which deterioration of the power storage device due to peeling of an active material layer or the like is suppressed can be provided.

BEST MODE FOR CARRYING OUT THE INVENTION

Figure 1A:
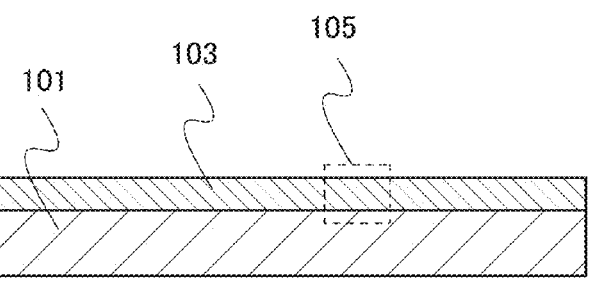
FIGS. 1A to 1D are examples of cross-sectional views illustrating an electrode of a power storage device.

Hereinafter, examples of embodiments of the present invention will be described with reference to the drawings. Note that the present invention is not limited to the following description, and it is easily understood by those skilled in the art that the mode and detail can be variously changed without departing from the spirit and scope of the present invention. Therefore, the present invention is not construed as being limited to the description of the embodiments below. In description referring to the drawings, in some cases, the same reference numerals are used in common for the same portions in different drawings. Further, in some cases, the same hatching patterns are applied to similar parts, and the similar parts are not necessarily designated by reference numerals.

Embodiment 1

In this embodiment, an electrode of a power storage device which is one embodiment of the present invention, and a method for manufacturing the electrode will be described.

The electrode of the power storage device and the manufacturing method thereof will be described with reference to FIGS. 1A to 1D and FIG. 2.

As illustrated in FIG. 1A, a crystalline silicon layer is formed as an active material layer 103 over a current collector 101 by a thermal CVD method, preferably an LPCVD method. Thus, an electrode including the current collector 101 and the active material layer 103 is formed.

The current collector 101 functions as a current collector of the electrode. Therefore, a conductive material having a foil shape, a plate shape, or a net shape is used. The current collector 101 can be formed using, but not particularly limited to, a metal element with high conductivity typified by platinum, aluminum, copper, or titanium. Note that in the case of using aluminum for the current collector, an aluminum alloy to which an element that improves heat resistance such as silicon, titanium, neodymium, scandium, or molybdenum is added is preferably used. Alternatively, the current collector 101 may be formed using a metal element that forms silicide by reacting with silicon. Examples of the metal element that forms silicide by reacting with silicon include zirconium, titanium, hafnium, vanadium, niobium, tantalum, chromium, molybdenum, tungsten, cobalt, nickel, and the like.

The crystalline silicon layer is formed as the active material layer 103 by an LPCVD method. In performing the LPCVD method, heating is performed at higher than 550° C. and lower than or equal to a temperature which an LPCVD apparatus and the current collector 101 can withstand, preferably higher than or equal to 580° C. and lower than 650° C., and a deposition gas including silicon is used as a source gas. Examples of the deposition gas including silicon are silicon hydride, silicon fluoride, and silicon chloride; typically, $SiH_4$, $Si_2H_6$, $SiF_4$, $SiCl_4$, $Si_2Cl_6$, and the like are given. Note that one or more of rare gases such as helium, neon, argon, and xenon and hydrogen may be mixed in the source gas.

Note that oxygen is included as an impurity in the active material layer 103 in some cases. This is because oxygen is desorbed from a quartz chamber of the LPCVD apparatus by the heating performed in the formation of the crystalline silicon layer as the active material layer 103 by the LPCVD method, and the oxygen diffuses into the crystalline silicon layer.

Note that an impurity element imparting one conductivity type, such as phosphorus or boron, may be added to the crystalline silicon layer. A crystalline silicon layer to which the impurity element imparting one conductivity type, such as phosphorus or boron, is added has higher conductivity, so that the electric conductivity of the electrode can be increased. Therefore, the discharge capacity or the charge capacity can be further increased.

By formation of the crystalline silicon layer as the active material layer 103 by the LPCVD method, a low-density region is not formed between the current collector 101 and the active material layer 103, electrons transfer easily at an interface between the current collector 101 and the crystalline silicon layer, and the adhesion can be increased. This can be explained by the following reason: active species of the source gas are constantly supplied to the crystalline silicon layer that is being deposited in a step of forming the crystalline silicon layer, so that a low-density region is unlikely to be formed in the crystalline silicon layer even if silicon diffuses into the current collector 101 from the crystalline silicon layer and a region lacking silicon (a sparse region) is formed, because the active species of the source gas are constantly supplied to the region. In addition, since the crystalline silicon layer is formed over the current collector 101 by vapor-phase growth, throughput can be improved.

Figure 1B:
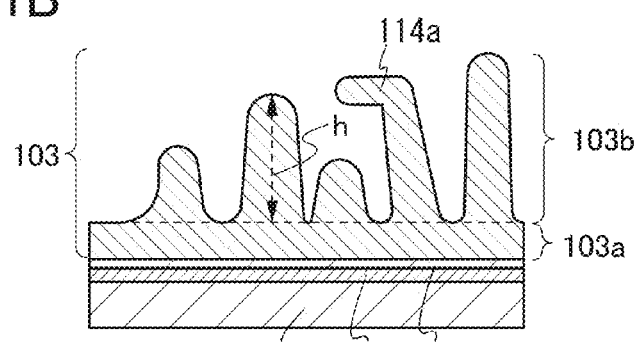
Figure 1C:
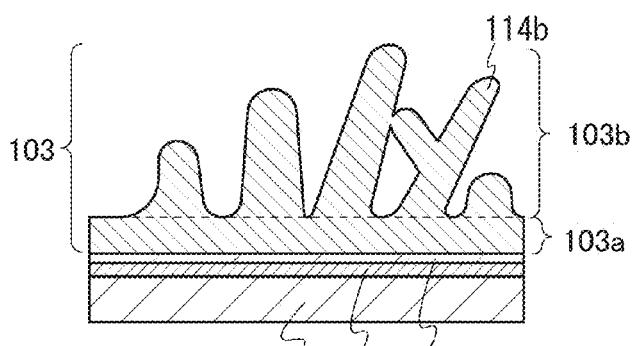
Figure 1D:
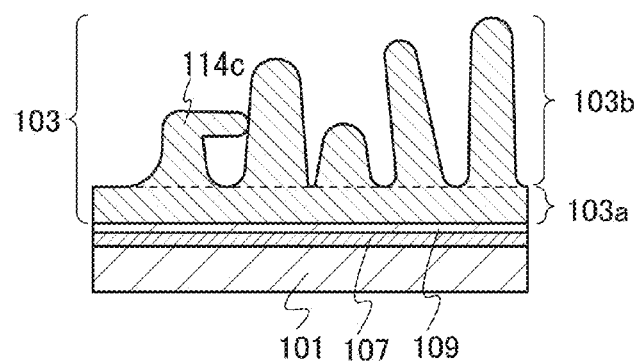

Here, examples of an enlarged view of the current collector 101 and the active material layer 103 at a portion surrounded by a dashed line 105 are illustrated in FIGS. 1B to 1D.

As illustrated in FIG. 1B, a mixed layer 107 is formed over the current collector 101. The mixed layer 107 may be formed using silicon and a metal element included in the current collector 101. Note that the mixed layer 107 formed using silicon and a metal element included in the current collector 101 is formed in the following manner. In formation of the crystalline silicon layer as the active material layer 103 by the LPCVD method, heating is performed and silicon included in the crystalline silicon layer diffuses into the current collector 101; thus, the mixed layer 107 is formed.

In the case where the current collector 101 is formed using a metal element that forms silicide by reacting with silicon, silicide including silicon and the metal element that forms silicide is formed in the mixed layer 107; typically, one or more of zirconium silicide, titanium silicide, hafnium silicide, vanadium silicide, niobium silicide, tantalum silicide, chromium silicide, molybdenum silicide, tungsten silicide, cobalt silicide, and nickel silicide is formed. Alternatively, an alloy layer of silicon and the metal element that forms silicide is formed.

Note that oxygen is included as an impurity in the mixed layer 107 in some cases. This is because oxygen is desorbed from the quartz chamber of the LPCVD apparatus by the heating performed in the formation of the crystalline silicon layer as the active material layer 103 by the LPCVD method, and the oxygen diffuses into the mixed layer 107.

Over the mixed layer 107, a metal oxide layer 109 which is formed using an oxide of the metal element included in the current collector 101 may be formed. For example, the metal oxide layer 109 is formed in such a manner that oxygen is desorbed from the quartz chamber of the LPCVD apparatus by the heating performed in the formation of the crystalline silicon layer as the active material layer 103 by the LPCVD method, and the current collector 101 is oxidized. Note that when the crystalline silicon layer is formed by the LPCVD method, by filling the chamber with a rare gas such as helium, neon, argon, or xenon, it is possible to prevent the formation of the metal oxide layer 109.

In the case where the current collector 101 is formed using the metal element that forms silicide by reacting with silicon, a metal oxide layer including an oxide of the metal element that forms silicide by reacting with silicon is formed as the metal oxide layer 109.

The metal oxide layer 109 includes, typically, zirconium oxide, titanium oxide, hafnium oxide, vanadium oxide, niobium oxide, tantalum oxide, chromium oxide, molybdenum oxide, tungsten oxide, cobalt oxide, nickel oxide, or the like. Note that when the current collector 101 is formed using titanium, zirconium, niobium, tungsten, or the like, the metal oxide layer 109 is formed using an oxide semiconductor such as titanium oxide, zirconium oxide, niobium oxide, or tungsten oxide; thus, resistance between the current collector 101 and the active material layer 103 can be reduced and the electric conductivity of the electrode can be increased. Therefore, the discharge capacity or the charge capacity can be further increased.

With the mixed layer 107 between the current collector 101 and the active material layer 103, resistance at the interface between the current collector 101 and the active material layer 103 can be reduced; thus, the electric conductivity of the electrode can be increased. Therefore, the discharge capacity or the charge capacity can be further increased. In addition, the adhesion between the current collector 101 and the active material layer 103 can be increased, so that deterioration of the power storage device can be suppressed.

The active material layer 103 includes a crystalline silicon region 103a and a whisker-like crystalline silicon region 103b formed over the crystalline silicon region 103a. Note that the interface between the crystalline silicon region 103a and the whisker-like crystalline silicon region 103b is not clear. Therefore, a plane that is at the same level as the bottom of the deepest valley among valleys formed between plural protrusions in the whisker-like crystalline silicon region 103b and is parallel to a surface of the current collector is regarded as the interface between the crystalline silicon region 103a and the whisker-like crystalline silicon region 103b.

The crystalline silicon region 103a is provided so as to cover the current collector 101. In the whisker-like crystalline silicon region 103b, a plurality of protrusions is provided like whiskers. The whisker-like crystalline silicon region 103b includes a protrusion 114a having a bending portion, as illustrated in FIG. 1B. Alternatively, the whisker-like crystalline silicon region 103b includes a protrusion 114b having a branching portion, as illustrated in FIG. 1C.

In the protrusion 114a illustrated in FIG. 1B, the direction of extension (i.e., the direction of an axis) of the bending portion is different from the direction of extension (i.e., the direction of an axis) of a protrusion serving as a base. The bending portion extends from a vicinity of a tip of the protrusion serving as the base. That is, a root of the bending portion (a vicinity of an interface between the bending portion and the protrusion serving as the base) exists in the vicinity of the tip of the protrusion serving as the base.

In the protrusion 114b illustrated in FIG. 1C, the direction of extension (i.e., the direction of an axis) of the branching portion is different from the direction of extension (i.e., the direction of an axis) of a protrusion serving as a base. The branching portion extends from a side surface of the protrusion serving as the base. That is, a root of the branching portion (a vicinity of an interface between the branching portion and the protrusion serving as the base) exists on the side surface of the protrusion serving as the base.

The protrusion 114a having the bending portion may have a portion which further bends or branches from the bending portion. The protrusion 114b having the branching portion may have a portion which further bends or branches from the branching portion.

A protrusion included in the whisker-like crystalline silicon region 103b may be in contact or intersect with another protrusion partly. The protrusions may be joined at the portion where they are in contact or intersect with each other.

For example, as illustrated in FIG. 1D, a protrusion 114c having a bending portion, which is included in the whisker-like crystalline silicon region 103b, may be partly in contact with another protrusion at the bending portion. The protrusion 114c may be joined to the another protrusion at the portion where they are in contact with each other.

The protrusion 114a having the bending portion in FIG. 1B, the protrusion 114b having the branching portion in FIG. 1C, and the protrusion 114c having the bending portion in FIG. 1D may coexist.

As illustrated in FIGS. 1B to 1D, the whisker-like crystalline silicon region includes protrusions having a bending or branching portion; therefore, the protrusions can tangle, be in contact, or intersect with each other easily.

Note that the plurality of protrusions included in the whisker-like crystalline silicon region 103b may each have a columnar shape such as a cylinder shape or a prism shape, or a needle shape such as a cone shape or a pyramid shape. The top of the protrusion may be curved. The plurality of protrusions may include both a columnar protrusion and a needle-like protrusion. Further, a surface of the protrusion may be uneven. The surface unevenness can increase the surface area of the active material layer.

The diameter of the protrusion included in the whisker-like crystalline silicon region 103b is greater than or equal to 50 nm and less than or equal to 10 µm, preferably greater than or equal to 500 nm and less than or equal to 3 µm, at an interface between the protrusion and the crystalline silicon region 103a. In addition, the length of an axis of the protrusion is greater than or equal to 0.5 µm and less than or equal to 1000 µm, preferably greater than or equal to 1 µm and less than or equal to 100 µm.

Note that a length h of the axis of the protrusion means the distance between the top or the center of the top surface of the protrusion and the crystalline silicon region 103a in the axis running through the top of the protrusion or the center of the top surface of the protrusion. In addition, the thickness of the crystalline silicon layer is the sum of the thickness of the crystalline silicon region 103a and the length of a normal from the top or top surface of the protrusion in the whisker-like crystalline silicon region 103b to the crystalline silicon region 103a (i.e., the height of the protrusion).

The shape of the bending or branching portion in the protrusion 114a having the bending portion, the protrusion 114b having the branching portion, or the protrusion 114c having the bending portion may be a columnar shape such as a cylinder shape or a prism shape, or a needle shape such as a cone shape or a pyramid shape. The top of the bending or branching portion may be curved. The shape of the protrusion serving as the base may be similar to or different from the shape of the bending or branching portion. For example, the protrusion serving as the base may have a columnar shape, whereas the bending portion may have a needle shape.

Note that the direction in which a protrusion projects from the crystalline silicon region 103a is referred to as a long-side direction (also referred to as a direction of extension or an axis direction). A cross-sectional shape along the long-side direction is referred to as a long-side cross-sectional shape. In addition, the shape of a plane where the long-side direction is a normal direction is referred to as a sliced cross-sectional shape.

The long-side directions of the plurality of protrusions formed in the whisker-like crystalline silicon region 103b may be one direction, for example, the normal direction to the surface of the crystalline silicon region 103a. In this case, the long-side directions of the protrusions may be substantially the same as the normal direction to the surface of the crystalline silicon region 103a, and it is preferable that the difference between the angles of the directions be typically within 5°.

Alternatively, the long-side directions of the plurality of protrusions formed in the whisker-like crystalline silicon region 103b may be uneven. Typically, the whisker-like crystalline silicon region 103b may include a first protrusion whose long-side direction is substantially the same as the normal direction and a second protrusion whose long-side direction is different from the normal direction. The second protrusion may have a longer axis than the first protrusion.

When the long-side directions of the protrusions are uneven, the protrusions tangle with each other in some cases; therefore, the protrusions are unlikely to be detached in charge and discharge of the power storage device.

The sliced cross-sectional shape of a cylinder-shaped or cone-shaped protrusion is circular. The sliced cross-sectional shape of a prism-shaped or pyramid-shaped protrusion is polygonal.

In the electrode of the power storage device described in this embodiment, the crystalline silicon layer functioning as the active material layer 103 includes the whisker-like crystalline silicon region 103b; therefore, the surface area is increased and thus the discharge capacity or charge capacity of the power storage device at a high current density can be increased. Since the whisker-like crystalline silicon region 103b includes the protrusion 114a having the bending portion, the protrusion 114b having the branching portion, or the protrusion 114c having the bending portion, the protrusions can tangle, be in contact, or intersect with each other easily. Accordingly, the strength of the protrusions is increased (i.e., the protrusions are difficult to break) and deterioration of the power storage device due to peeling of the active material layer or the like can be suppressed.

Since the whisker-like crystalline silicon region 103b includes the protrusion 114a having the bending portion, the protrusion 114b having the branching portion, or the protrusion 114c having the bending portion, a decrease in the silicon density of the whisker-like crystalline silicon region 103b can be suppressed. In particular, in the whisker-like crystalline silicon region 103b, a decrease in the silicon density of a region which does not include a vicinity of a root of a protrusion (a vicinity of an interface between the protrusion and the crystalline silicon region 103a) can be suppressed. Further, the amount of silicon can be increased in the whisker-like crystalline silicon region, and the surface area can be increased. In a power storage device manufactured using the crystalline silicon layer including the whisker-like crystalline silicon region 103b, the energy density per unit volume of the power storage device can be improved.

The electrode of the power storage device described in this embodiment includes at least the mixed layer between the current collector and the crystalline silicon layer functioning as the active material layer. Thus, interface resistance between the current collector and the crystalline silicon layer can be reduced, and the adhesion therebetween can be increased; therefore, the discharge capacity or the charge capacity can be increased and deterioration of the power storage device can be suppressed.

Figure 2:
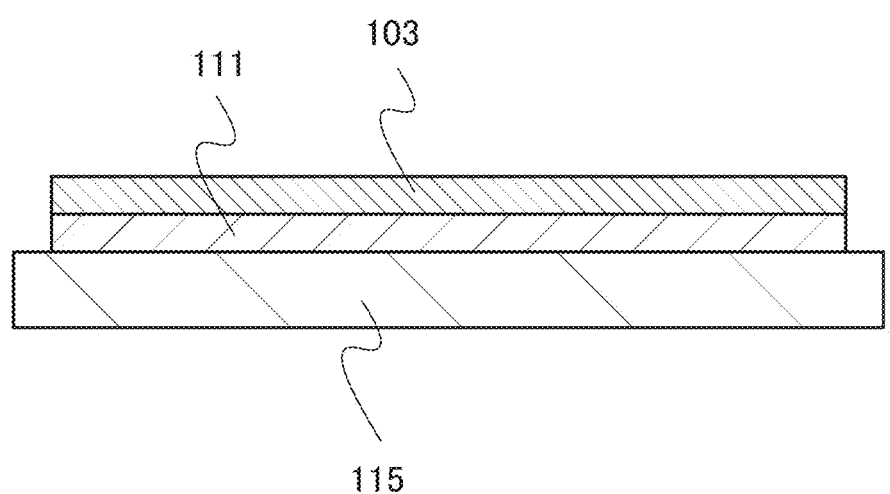
FIG. 2 is an example of a cross-sectional view illustrating an electrode of a power storage device.

Note that FIGS. 1A to 1D illustrate an embodiment in which the current collector 101 is formed using a conductive material having a foil shape, a plate shape, or a net shape; however, as illustrated in FIG. 2, a current collector 111 can be formed in a film form over a substrate 115 by using a sputtering method, an evaporation method, a printing method, an inkjet method, a CVD method, or the like as appropriate.

According to this embodiment, a power storage device having an improved performance such as higher discharge capacity or charge capacity can be provided. A power storage device in which deterioration of the power storage device due to peeling of an active material layer or the like is suppressed can be provided.

Embodiment 2

In this embodiment, a structure of a power storage device will be described with reference to FIGS. 3A and 3B.

First, a structure of a secondary battery is described below as a power storage device. Here, a structure of a lithium ion battery, which is a typical example of the secondary battery, is described.

Figure 3A:
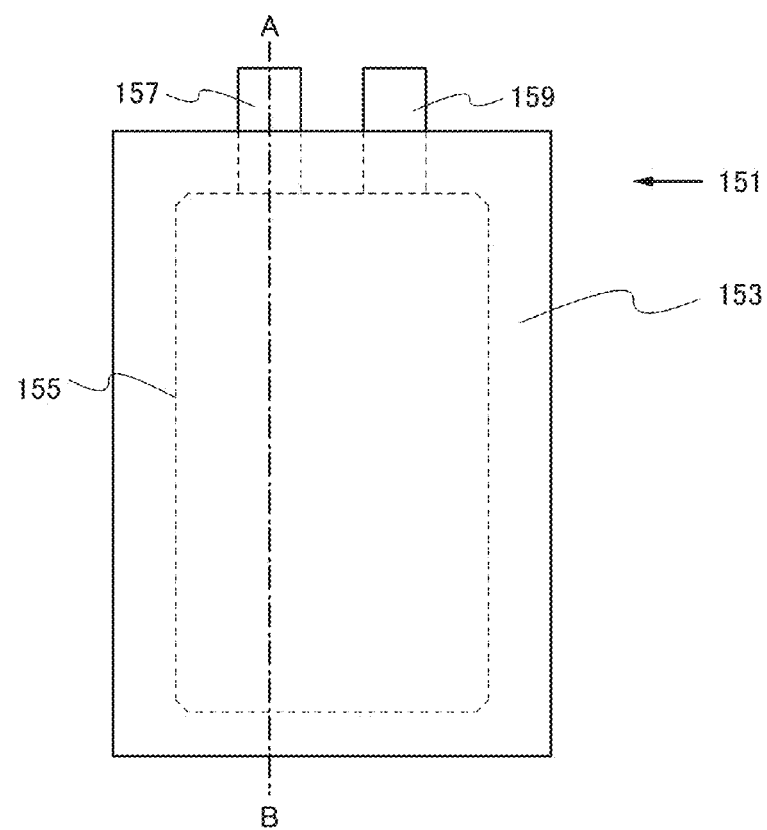
FIGS. 3A and 3B are a plan view and a cross-sectional view, respectively, which illustrate one embodiment of a power storage device.
Figure 3B:
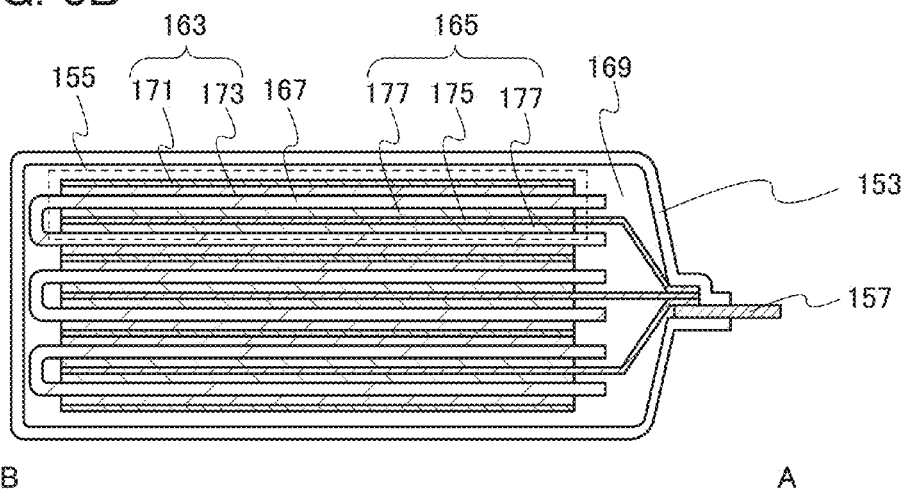

FIG. 3A is a plan view of a power storage device 151, and FIG. 3B is a cross-sectional view taken along dashed-dotted line A-B in FIG. 3A. In this embodiment, a sealed thin power storage device is described as the power storage device 151.

The power storage device 151 illustrated in FIG. 3A includes a power storage cell 155 in an exterior member 153. Terminal portions 157 and 159 connected to the power storage cell 155 are further provided. As the exterior member 153, a laminate film, a polymer film, a metal film, a metal case, a plastic case, or the like can be used.

As illustrated in FIG. 3B, the power storage cell 155 includes a negative electrode 163, a positive electrode 165, a separator 167 between the negative electrode 163 and the positive electrode 165, and an electrolyte 169 with which the exterior member 153 including the power storage cell 155 and the separator 167 is filled.

The negative electrode 163 includes a negative electrode current collector 171 and a negative electrode active material layer 173.

The positive electrode 165 includes a positive electrode current collector 175 and a positive electrode active material layer 177. The negative electrode active material layer 173 is formed on one or both of surfaces of the negative electrode current collector 171. The positive electrode active material layer 177 is formed on one or both of surfaces of the positive electrode current collector 175.

The negative electrode current collector 171 is connected to the terminal portion 159. The positive electrode current collector 175 is connected to the terminal portion 157. Further, the terminal portions 157 and 159 each partly extend outside the exterior member 153.

Note that although the sealed thin power storage device is described as the power storage device 151 in this embodiment, the power storage device can have a variety of structures; for example, a button power storage device, a cylindrical power storage device, or a rectangular power storage device can be used. Further, although the structure in which the positive electrode, the negative electrode, and the separator are stacked is described in this embodiment, a structure in which the positive electrode, the negative electrode, and the separator are rolled may be employed.

As the negative electrode current collector 171, the current collector 101 or the current collector 111 described in Embodiment 1 can be used.

As the negative electrode active material layer 173, the active material layer 103, which is formed using the crystalline silicon layer described in Embodiment 1, can be used. Note that the crystalline silicon layer may be pre-doped with lithium. In addition, by forming the active material layer 103, which is formed using the crystalline silicon layer, with the negative electrode current collector 171 held by a frame-shaped susceptor in an LPCVD apparatus, the active material layer 103 can be formed on both surfaces of the negative electrode current collector 171 at the same time; therefore, the number of steps can be reduced.

Aluminum, stainless steel, or the like is used for the positive electrode current collector 175. The positive electrode current collector 175 can have a foil shape, a plate shape, a net shape, a film shape, or the like as appropriate.

The positive electrode active material layer 177 can be formed using $LiFeO_2$, $LiCoO_2$, $LiNiO_2$, $LiMn_2O_4$, $LiFePO_4$, $LiCoPO_4$, $LiNiPO_4$, $LiMn_2PO_4$, $V_2O_5$, $Cr_2O_5$, $MnO_2$, or another lithium compound as a material. Note that in the case where carrier ions are alkali metal ions other than lithium ions or alkaline earth metal ions, the positive electrode active material layer 177 can be formed using, instead of lithium in the above lithium compounds, an alkali metal (e.g., sodium or potassium) or an alkaline earth metal (e.g., beryllium, magnesium, calcium, strontium, or barium).

As a solute of the electrolyte 169, a material in which lithium ions that are carrier ions can transfer and exist stably is used. Typical examples of the solute of the electrolyte include lithium salt such as $LiClO_4$, $LiAsF_6$, $LiBF_4$, $LiPF_6$, and $Li(C_2F_5SO_2)_2N$. Note that in the case where carrier ions are alkali metal ions other than lithium ions or alkaline earth metal ions, the solute of the electrolyte 169 can include alkali metal salt such as sodium salt or potassium salt, alkaline earth metal salt such as beryllium salt, magnesium salt, calcium salt, strontium salt, or barium salt, or the like, as appropriate.

As a solvent of the electrolyte 169, a material which can transfer lithium ions (or other carrier ions) is used. As the solvent of the electrolyte 169, an aprotic organic solvent is preferably used. Typical examples of the aprotic organic solvent include ethylene carbonate, propylene carbonate, dimethyl carbonate, diethyl carbonate, γ-butyrolactone, acetonitrile, dimethoxyethane, tetrahydrofuran, and the like, and one or more of these materials can be used. When a gelled polymer is used as the solvent of the electrolyte 169, safety against liquid leakage or the like is increased. In addition, the power storage device 151 can be thin and lightweight. Typical examples of the gelled polymer include a silicon gel, an acrylic gel, an acrylonitrile gel, polyethylene oxide, polypropylene oxide, a fluorine-based polymer, and the like.

As the electrolyte 169, a solid electrolyte such as $Li_3PO_4$ can be used.

An insulating porous material is used for the separator 167. Typical examples of the separator 167 include cellulose (paper), polyethylene, polypropylene, and the like.

A lithium ion battery has a small memory effect, a high energy density, and a high discharge capacity. In addition, the driving voltage of a lithium ion battery is high. Thus, the size and weight of the lithium ion battery can be reduced. Further, the lithium ion battery does not easily deteriorate owing to repetitive charge and discharge and can be used for a long time, so that cost can be reduced.

Next, a capacitor is described as a power storage device. Typical examples of the capacitor include a double-layer capacitor, a lithium ion capacitor, and the like.

In the case of a capacitor, instead of the positive electrode active material layer 177 in the secondary battery illustrated in FIG. 3B, a material capable of reversibly adsorbing or absorbing at least one of lithium ions (or other carrier ions) and anions may be used. Typically, the positive electrode active material layer 177 can be formed using active carbon, a conductive polymer, or a polyacene organic semiconductor (PAS), for example.

The lithium ion capacitor has high efficiency of charge and discharge, capability of rapidly performing charge and discharge, and a long life to withstand repeated use.

By using the negative electrode described in Embodiment 1 as the negative electrode 163, a power storage device having high discharge capacity or charge capacity can be manufactured.

In addition, by using the current collector and the active material layer described in Embodiment 1 in a negative electrode of an air cell which is one embodiment of a power storage device, a power storage device having high discharge capacity or charge capacity can be manufactured.

Embodiment 3

In this embodiment, an application example of the power storage device described in Embodiment 2 will be described with reference to FIGS. 4A to 4D.

The power storage device described in Embodiment 2 can be used in electronic devices, e.g., cameras such as digital cameras or video cameras, digital photo frames, mobile phones (also referred to as cellular phones or cellular phone devices), portable game machines, portable information terminals, or audio reproducing devices. Further, the power storage device can be used in electric propulsion vehicles such as electric cars, hybrid cars, train vehicles, maintenance vehicles, carts, or electric wheelchairs. Here, examples of the electric propulsion vehicles are described.

Figure 4A:
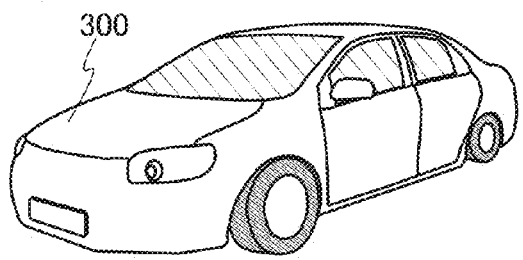
FIGS. 4A to 4D are perspective views illustrating application examples of a power storage device.
Figure 4B:
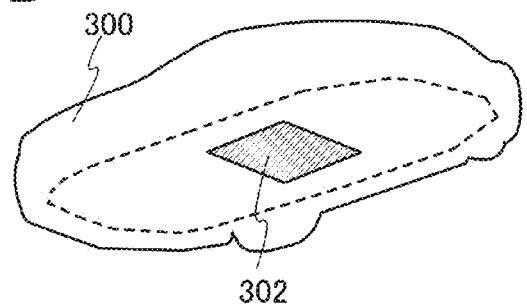

FIG. 4A illustrates a structure of a four-wheeled automobile 300 which is one of the electric propulsion vehicles. The automobile 300 is an electric car or a hybrid car. The automobile 300 is an example in which a power storage device 302 is provided in a bottom portion. In order to clearly show the position of the power storage device 302 in the automobile 300, FIG. 4B illustrates the outline of the automobile 300 and the power storage device 302 provided in the bottom portion of the automobile 300. The power storage device described in Embodiment 2 can be used as the power storage device 302. Charge of the power storage device 302 can be performed by external power supply using a plug-in technique or a wireless power feeding system.

Figure 4C:
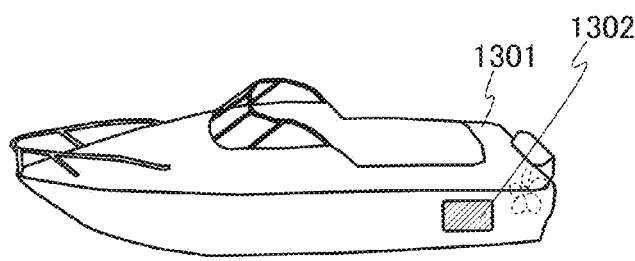

FIG. 4C illustrates a structure of a motorboat 1301 which is one of the electric propulsion vehicles. FIG. 4C illustrates the case where the motorboat 1301 includes a power storage device 1302 equipped on a side portion of the body of the motorboat. The power storage device described in Embodiment 2 can be used as the power storage device 1302. Charge of the power storage device 1302 can be performed by external power supply using a plug-in technique or a wireless power feeding system. For example, a power feeding device for charging the motorboat 1301 (i.e., for charging the power storage device 1302) may be equipped at a mooring in a harbor.

Figure 4D:
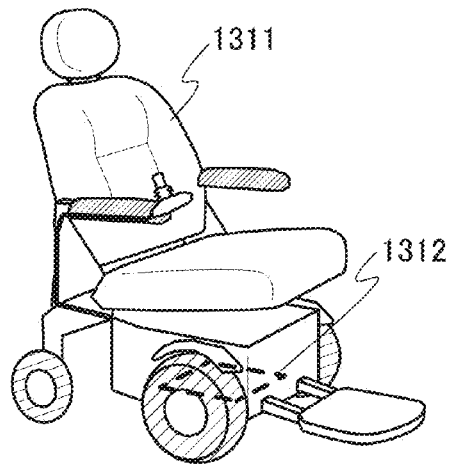

FIG. 4D illustrates a structure of an electric wheelchair 1311 which is one of the electric propulsion vehicles. FIG. 4D illustrates the case where the electric wheelchair 1311 includes a power storage device 1312 in a bottom portion. The power storage device described in Embodiment 2 can be used as the power storage device 1312. Charge of the power storage device 1312 can be performed by external power supply using a plug-in technique or a wireless power feeding system.

Embodiment 4

In this embodiment, an example in which a secondary battery that is an example of a power storage device according to one embodiment of the present invention is used in a wireless power feeding system (hereinafter referred to as an RF power feeding system) will be described with reference to block diagrams in FIG. 5 and FIG. 6. In each of the block diagrams, independent blocks show elements within a power receiving device and a power feeding device, which are classified according to their functions. However, it may be practically difficult to completely separate the elements according to their functions; in some cases, one element can involve a plurality of functions.

First, the RF power feeding system is described with reference to FIG. 5.

A power receiving device 600 is an electronic device or an electric propulsion vehicle which is driven by electric power supplied from a power feeding device 700, and can be applied to another device which is driven by electric power, as appropriate. Typical examples of the electronic device include cameras such as digital cameras or video cameras, digital photo frames, mobile phones (also referred to as cellular phones or cellular phone devices), portable game machines, portable information terminals, audio reproducing devices, display devices, computers, and the like. Typical examples of the electric propulsion vehicle include electric cars, hybrid cars, train vehicles, maintenance vehicles, carts, electric wheelchairs, and the like. In addition, the power feeding device 700 has a function of supplying electric power to the power receiving device 600.

Figure 5:
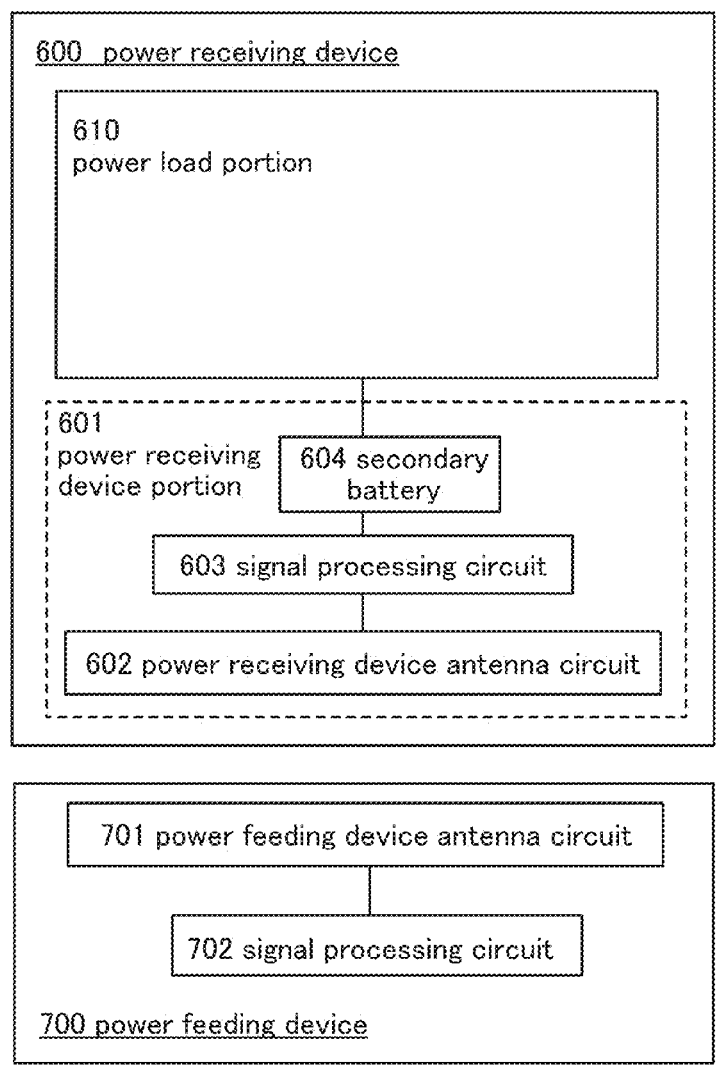
FIG. 5 is a diagram illustrating an example of a structure of a wireless power feeding system.

In FIG. 5, the power receiving device 600 includes a power receiving device portion 601 and a power load portion 610. The power receiving device portion 601 includes at least a power receiving device antenna circuit 602, a signal processing circuit 603, and a secondary battery 604. The power feeding device 700 includes at least a power feeding device antenna circuit 701 and a signal processing circuit 702.

The power receiving device antenna circuit 602 has a function of receiving a signal transmitted by the power feeding device antenna circuit 701 or transmitting a signal to the power feeding device antenna circuit 701. The signal processing circuit 603 processes a signal received by the power receiving device antenna circuit 602 and controls charge of the secondary battery 604 and supply of electric power from the secondary battery 604 to the power load portion 610. In addition, the signal processing circuit 603 controls operation of the power receiving device antenna circuit 602. That is, the signal processing circuit 603 can control the intensity, the frequency, or the like of a signal transmitted by the power receiving device antenna circuit 602. The power load portion 610 is a driving portion which receives electric power from the secondary battery 604 and drives the power receiving device 600. Typical examples of the power load portion 610 include a motor, a driving circuit, and the like. Another device which drives the power receiving device by receiving electric power can be used as the power load portion 610 as appropriate. The power feeding device antenna circuit 701 has a function of transmitting a signal to the power receiving device antenna circuit 602 or receiving a signal from the power receiving device antenna circuit 602. The signal processing circuit 702 processes a signal received by the power feeding device antenna circuit 701. In addition, the signal processing circuit 702 controls operation of the power feeding device antenna circuit 701. That is, the signal processing circuit 702 can control the intensity, the frequency, or the like of a signal transmitted by the power feeding device antenna circuit 701.

The secondary battery according to one embodiment of the present invention is used as the secondary battery 604 included in the power receiving device 600 in the RF power feeding system illustrated in FIG. 5.

By using the secondary battery according to one embodiment of the present invention in the RF power feeding system, the discharge capacity or the charge capacity (also referred to as the amount of power storage) can be increased as compared with that of a conventional secondary battery. Therefore, the time interval of the wireless power feeding can be longer (frequent power feeding can be omitted).

In addition, by using the secondary battery according to one embodiment of the present invention in the RF power feeding system, the power receiving device 600 can be compact and lightweight if the discharge capacity or the charge capacity with which the power load portion 610 can be driven is the same as that of a conventional secondary battery. Therefore, the total cost can be reduced.

Next, another example of the RF power feeding system is described with reference to FIG. 6.

Figure 6:
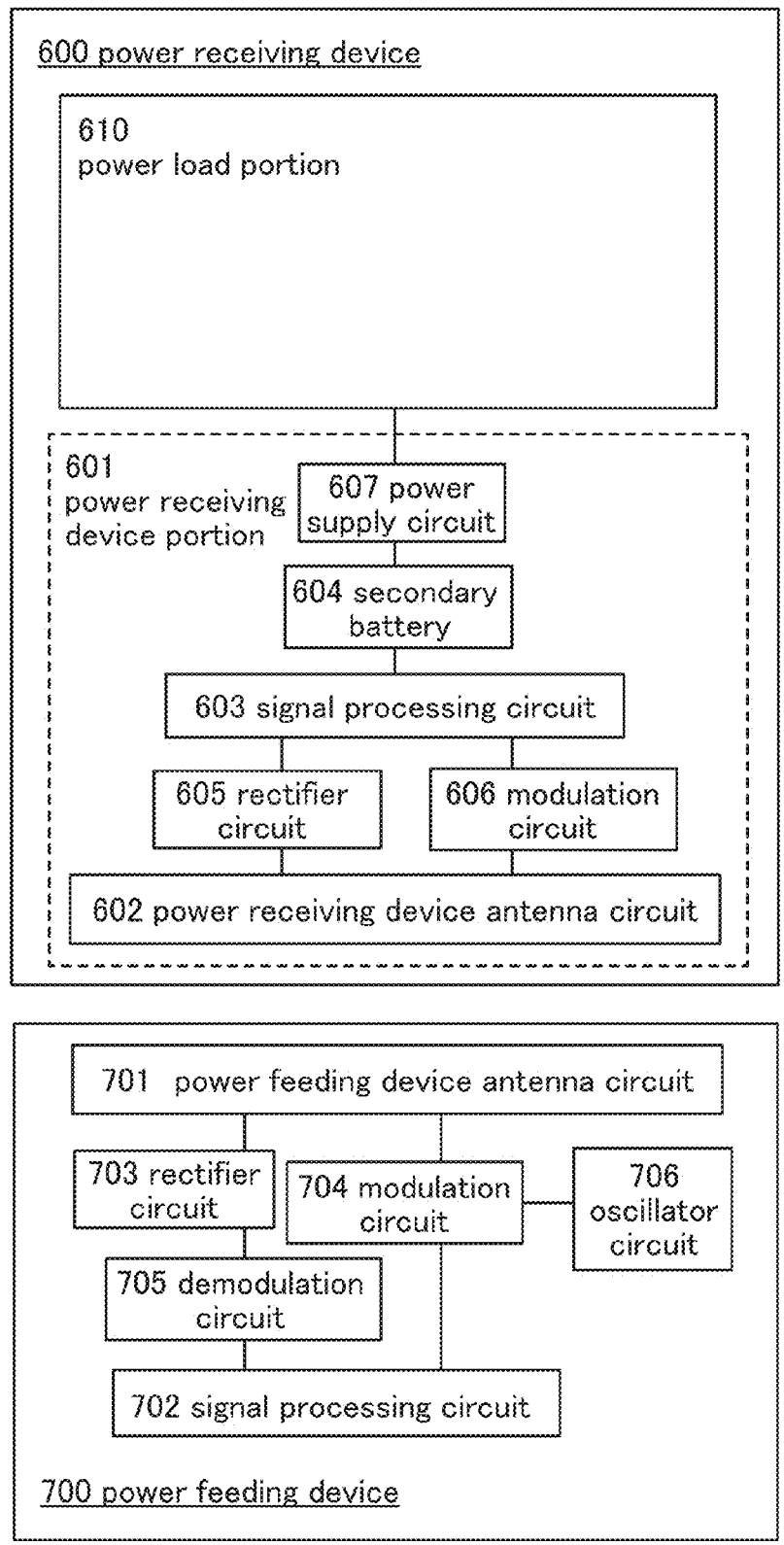
FIG. 6 is a diagram illustrating an example of a structure of a wireless power feeding system.

In FIG. 6, the power receiving device 600 includes the power receiving device portion 601 and the power load portion 610. The power receiving device portion 601 includes at least the power receiving device antenna circuit 602, the signal processing circuit 603, the secondary battery 604, a rectifier circuit 605, a modulation circuit 606, and a power supply circuit 607. In addition, the power feeding device 700 includes at least the power feeding device antenna circuit 701, the signal processing circuit 702, a rectifier circuit 703, a modulation circuit 704, a demodulation circuit 705, and an oscillator circuit 706.

The power receiving device antenna circuit 602 has a function of receiving a signal transmitted by the power feeding device antenna circuit 701 or transmitting a signal to the power feeding device antenna circuit 701. When a signal transmitted by the power feeding device antenna circuit 701 is received, the rectifier circuit 605 has a function of generating DC voltage from the signal received by the power receiving device antenna circuit 602. The signal processing circuit 603 has a function of processing a signal received by the power receiving device antenna circuit 602 and controlling charge of the secondary battery 604 and supply of electric power from the secondary battery 604 to the power supply circuit 607. The power supply circuit 607 has a function of converting voltage stored by the secondary battery 604 into voltage needed for the power load portion 610. The modulation circuit 606 is used when a certain response is transmitted from the power receiving device 600 to the power feeding device 700.

With the power supply circuit 607, electric power supplied to the power load portion 610 can be controlled. Thus, overvoltage application to the power load portion 610 can be suppressed, and deterioration or breakdown of the power receiving device 600 can be suppressed.

In addition, with the modulation circuit 606, a signal can be transmitted from the power receiving device 600 to the power feeding device 700. Therefore, when the amount of power charged in the power receiving device 600 is judged to reach a certain amount, a signal is transmitted from the power receiving device 600 to the power feeding device 700 so that power feeding from the power feeding device 700 to the power receiving device 600 can be stopped. As a result, the secondary battery 604 is not fully charged, so that the number of times of charging the secondary battery 604 can be increased.

The power feeding device antenna circuit 701 has a function of transmitting a signal to the power receiving device antenna circuit 602 or receiving a signal from the power receiving device antenna circuit 602. When a signal is transmitted to the power receiving device antenna circuit 602, the signal processing circuit 702 generates a signal which is transmitted to the power receiving device. The oscillator circuit 706 is a circuit which generates a signal with a constant frequency. The modulation circuit 704 has a function of applying voltage to the power feeding device antenna circuit 701 in accordance with the signal generated by the signal processing circuit 702 and the signal with a constant frequency generated by the oscillator circuit 706. Thus, a signal is output from the power feeding device antenna circuit 701. On the other hand, when a signal from the power receiving device antenna circuit 602 is received, the rectifier circuit 703 has a function of rectifying the received signal. The demodulation circuit 705 extracts a signal transmitted from the power receiving device 600 to the power feeding device 700, from signals rectified by the rectifier circuit 703. The signal processing circuit 702 has a function of analyzing the signal extracted by the demodulation circuit 705.

Note that any circuit may be provided between circuits as long as the RF power feeding can be performed. For example, after the power receiving device 600 receives a signal and the rectifier circuit 605 generates DC voltage, a circuit such as a DC-DC converter or a regulator that is provided in a subsequent stage may generate constant voltage. Thus, overvoltage application to the inside of the power receiving device 600 can be suppressed.

The secondary battery according to one embodiment of the present invention is used as the secondary battery 604 included in the power receiving device 600 in the RF power feeding system illustrated in FIG. 6.

By using the secondary battery according to one embodiment of the present invention in the RF power feeding system, the discharge capacity or the charge capacity can be increased as compared with that of a conventional secondary battery; therefore, the time interval of the wireless power feeding can be longer (frequent power feeding can be omitted).

In addition, by using the secondary battery according to one embodiment of the present invention in the RF power feeding system, the power receiving device 600 can be compact and lightweight if the discharge capacity or the charge capacity with which the power load portion 610 can be driven is the same as that of a conventional secondary battery. Therefore, the total cost can be reduced.

Note that in the case where the secondary battery according to one embodiment of the present invention is used in the RF power feeding system and the power receiving device antenna circuit 602 and the secondary battery 604 overlap with each other, it is preferable that the impedance of the power receiving device antenna circuit 602 be not changed by deformation of the secondary battery 604 due to charge and discharge of the secondary battery 604 and deformation of an antenna due to the above deformation. When the impedance of the antenna is changed, in some cases, electric power is not supplied sufficiently. The secondary battery 604 may be placed in a battery pack formed using metal or ceramics, for example. Note that in that case, the power receiving device antenna circuit 602 and the battery pack are preferably separated from each other by several tens of micrometers or more.

In this embodiment, a charging signal has no limitation on its frequency and may have any band of frequency as long as electric power can be transmitted. For example, the charging signal may have any of an LF band of 135 kHz (long wave), an HF band of 13.56 MHz (short wave), a UHF band of 900 MHz to 1 GHz (ultra high frequency wave), and a microwave band of 2.45 GHz.

A signal transmission method may be selected as appropriate from various methods including an electromagnetic coupling method, an electromagnetic induction method, a resonance method, and a microwave method. In order to prevent energy loss due to foreign substances including moisture, such as rain or mud, an electromagnetic induction method or a resonance method using a low frequency band, specifically, using frequencies of a short wave of 3 MHz to 30 MHz, a medium wave of 300 kHz to 3 MHz, a long wave of 30 kHz to 300 kHz, or a very-low frequency wave of 3 kHz to 30 kHz is preferably used.

This embodiment can be implemented in combination with any of the above embodiments.

Example 1

In this example, a secondary battery which is one embodiment of the present invention will be described with reference to FIG. 7, FIG. 8, FIG. 9, FIG. 10, and FIG. 11. In this example, the secondary battery which is one embodiment of the present invention and a secondary battery for comparison (hereinafter referred to as a comparative secondary battery) were manufactured and their characteristics were compared.

(Step of Manufacturing Electrode of Secondary Battery)

First, a step of manufacturing an electrode of the secondary battery is described.

An active material layer was formed over a current collector, so that the electrode of the secondary battery was manufactured.

As a material of the current collector, titanium was used. As the current collector, a sheet of a titanium film (also referred to as a titanium sheet) with a thickness of 100 µm was used.

For the active material layer, crystalline silicon was used.

Over the titanium film, which is the current collector, a crystalline silicon layer serving as the active material layer was formed by an LPCVD method. The crystalline silicon layer was formed by the LPCVD method under the following conditions: silane was introduced as a source gas into a reaction chamber with a flow rate of 300 sccm; the pressure of the reaction chamber was 20 Pa; and the temperature of the reaction chamber was 600° C. The reaction chamber used was made using quartz. When the temperature of the current collector was increased, a small amount of He was introduced.

The crystalline silicon layer obtained in the above step was used as the active material layer of the secondary battery.

(Structure of Electrode of Secondary Battery)

Figure 7:
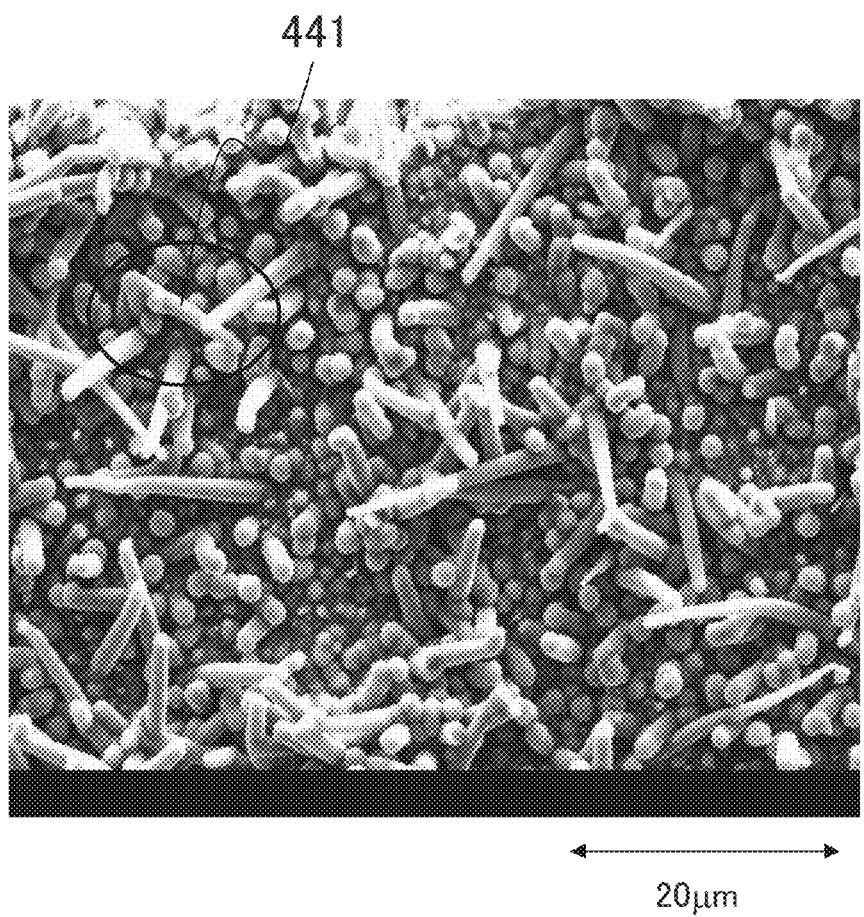
FIG. 7 is a plane SEM image of an active material layer.

FIG. 7 is a plane scanning-electron-microscope (SEM) image of the crystalline silicon layer obtained in the above step.

As shown in FIG. 7, the crystalline silicon layer obtained in the above step includes a whisker-like crystalline silicon region including a plurality of columnar or needle-like protrusions.

As shown in FIG. 7, the whisker-like crystalline silicon region includes a protrusion 441 having a bending portion. The protrusion 441 partly intersects with another protrusion.

In the protrusion 441 shown in FIG. 7, the direction of extension (i.e., the direction of an axis) of the bending portion is different from the direction of extension (i.e., the direction of an axis) of a protrusion serving as a base. The bending portion extends from a vicinity of a tip of the protrusion serving as the base. That is, a root of the bending portion (a vicinity of an interface between the bending portion and the protrusion serving as the base) exists in the vicinity of the tip of the protrusion serving as the base.

Since the crystalline silicon layer obtained in the above step includes the whisker-like crystalline silicon region, the surface area of the active material layer can be increased. The whisker-like crystalline silicon region includes the protrusion 441 having the bending portion. The whisker-like crystalline silicon region includes a protrusion which is in contact with another protrusion on a side surface or in the vicinity of a tip of the protrusion. Thus, the protrusions easily tangle with each other, or the protrusions are in contact with each other. Accordingly, deterioration such as peeling of the active material layer or the like can be suppressed. Further, the amount of silicon can be increased in the whisker-like crystalline silicon region, and the surface area can be increased.

In the whisker-like crystalline silicon region, the length of an axis of a long protrusion is approximately 15 µm to 20 µm. In addition, without limitation to protrusions having such long axes, a plurality of short protrusions having short axes exists among the protrusions having the long axes. Some protrusions have axes generally perpendicular to the titanium film, and some protrusions have slanting axes.

Some protrusions have curved tops. Some needle-like protrusions have a narrower diameter toward the tip. The directions of the axes of the protrusions were uneven. In addition, the diameter of a root of a protrusion (a vicinity of an interface between the protrusion and a crystalline silicon region) was 1 µm to 2 µm. Both a columnar protrusion and a needle-like protrusion were observed.

Figure 8:
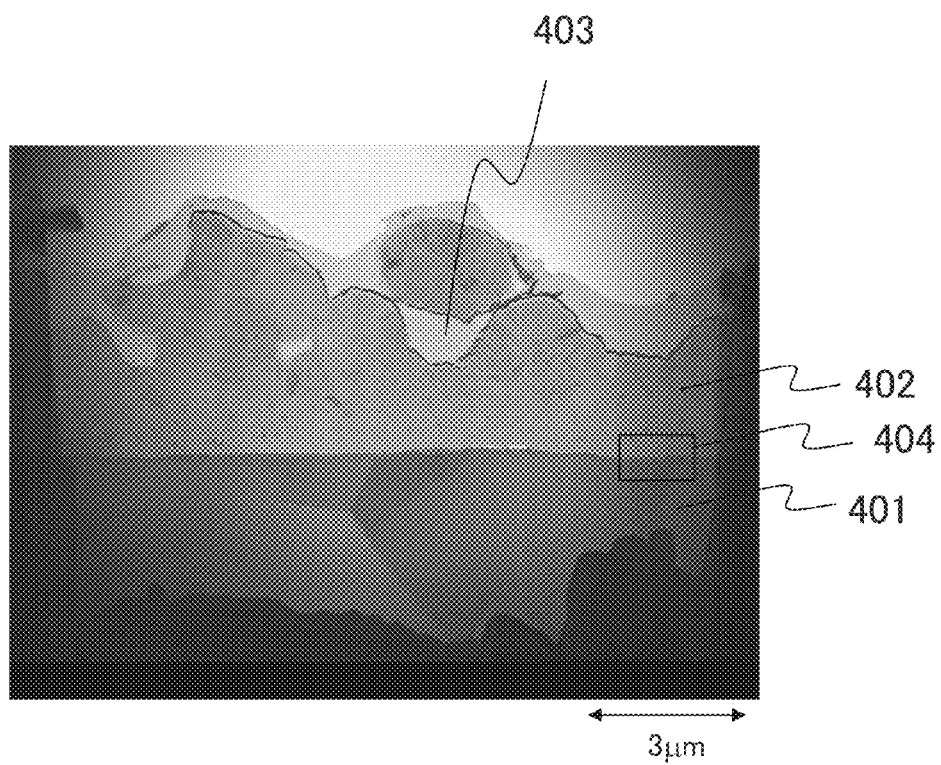
FIG. 8 is a cross-sectional TEM image of an active material layer.

Next, FIG. 8 is a cross-sectional transmission-electron-microscope (TEM) image of the crystalline silicon obtained in the above step. As shown in FIG. 8, a crystalline silicon layer 402, which is an active material layer, is formed over a titanium film 401, which is a current collector. From FIG. 8, it is found that a low-density region is not formed in a vicinity of an interface 404 between the titanium film 401 and the crystalline silicon layer 402. The crystalline silicon layer 402 includes a crystalline silicon region and a whisker-like crystalline silicon region including a plurality of protrusions which projects from the crystalline silicon region. In addition, the whisker-like crystalline silicon region includes a space 403 (i.e., a region where no protrusion is present) between the protrusions.

In the crystalline silicon layer, the plurality of protrusions is provided over the crystalline silicon region. It was observed that part of the crystalline silicon layer including the protrusions had a thickness of approximately 3.0 μm. The thickness of the crystalline silicon region at a valley formed between the plural protrusions was approximately 1.5 μm to 2.0 μm. As shown in FIG. 7, the length of the axis of a long protrusion is approximately 15 μm to 20 μm, which is not shown in FIG. 8.

Figure 9:
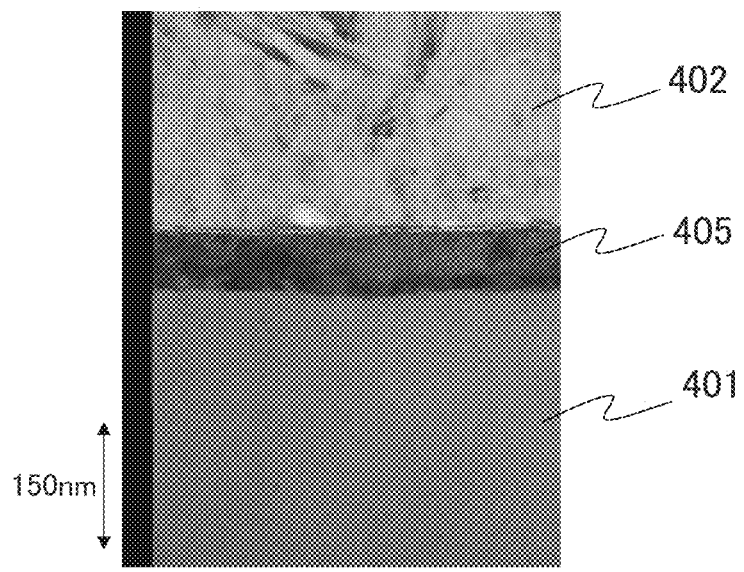
FIG. 9 is an enlarged image of a vicinity of an interface between a current collector and an active material layer.

FIG. 9 is an enlarged cross-sectional TEM image of part of FIG. 8. FIG. 9 is an enlarged image of the vicinity of the interface 404 between the titanium film 401 and the crystalline silicon layer 402 shown in FIG. 8. From FIG. 9, it is found that a layer 405 is formed in the vicinity of the interface between the titanium film 401 and the crystalline silicon layer 402.

Figure 10:
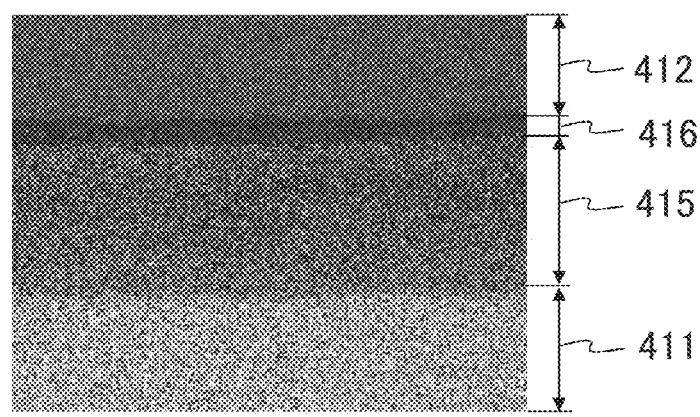
FIG. 10 shows a two-dimensional element mapping of a vicinity of an interface between a current collector and an active material layer using an EDX.

FIG. 10 shows results of two-dimensional element mapping using an energy dispersive X-ray spectrometry (EDX) of a cross section of the vicinity of the interface between the titanium film 401 and the crystalline silicon layer 402. A region 411 includes titanium as a main component. A region 412 includes silicon as a main component. A region 416 includes oxygen and titanium as components. A region 415 includes titanium and silicon as components. The region 415 also includes oxygen as an impurity. From FIG. 10, it is found that the region 411 including titanium as a main component, the region 415 including titanium and silicon as components, the region 416 including oxygen and titanium as components, and the region 412 including silicon as a main component are stacked in this order. The region 411 corresponds to the titanium film 401, and the region 412 corresponds to the crystalline silicon layer 402. The region 415 is a mixed layer including titanium and silicon. The region 416 is a metal oxide layer.

From the results of the two-dimensional element mapping using an EDX in FIG. 10, it is found that the layer 405 shown in FIG. 9 includes the mixed layer including titanium and silicon and the metal oxide layer over the mixed layer. In the measurement area shown in FIG. 10, the metal oxide layer is formed to cover the entire surface of the mixed layer. The thickness of the mixed layer including titanium and silicon, which is included in the layer 405, was approximately 65 nm to 75 nm.

(Step of Manufacturing Secondary Battery)

A step of manufacturing the secondary battery of this example is described.

The active material layer was formed over the current collector in the above manner, so that the electrode was formed. The secondary battery was manufactured using the obtained electrode. Here, a coin-type secondary battery was manufactured. A method for manufacturing the coin-type secondary battery is described with reference to FIG. 11.

Figure 11:
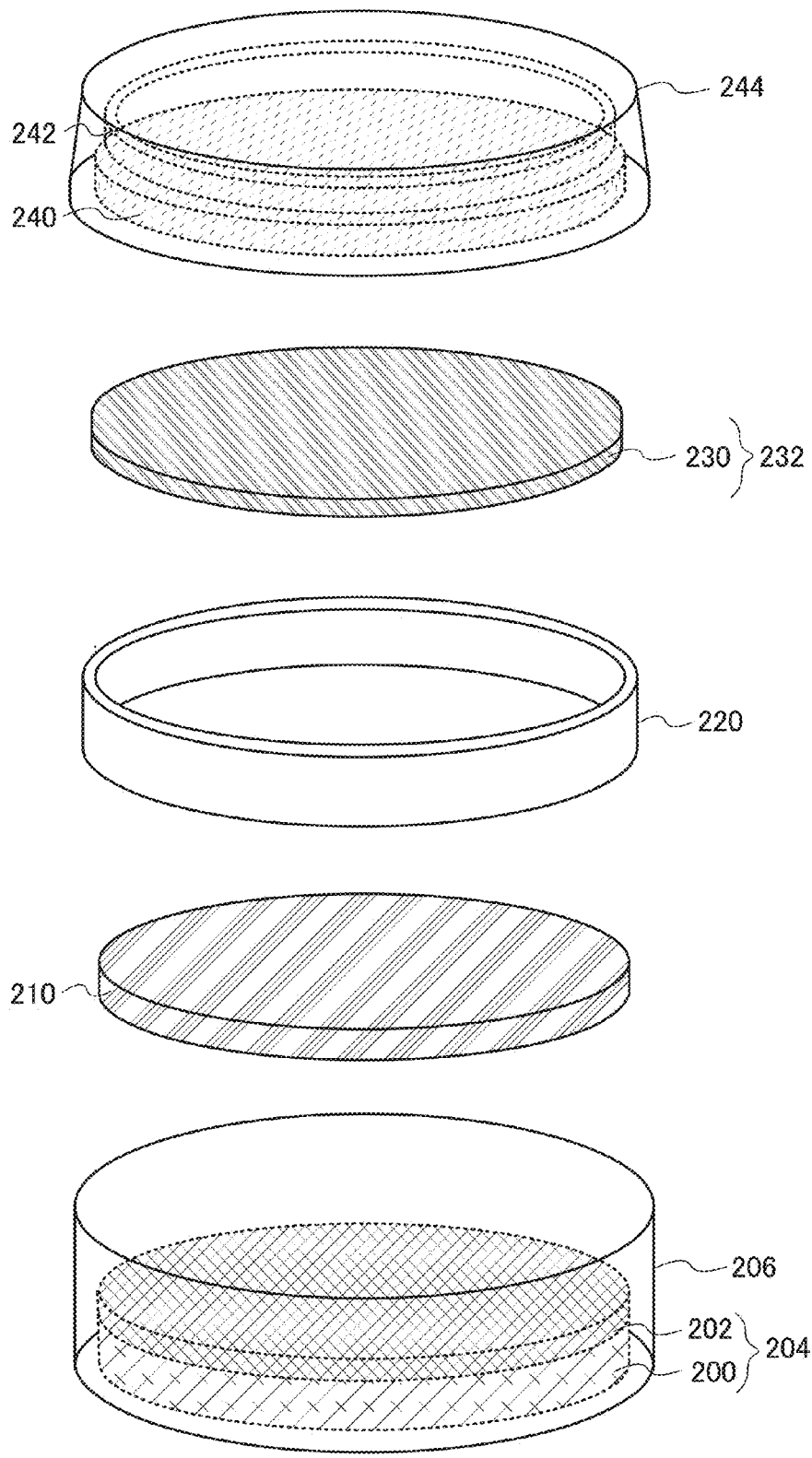
FIG. 11 illustrates an example of a method for manufacturing a secondary battery.

As illustrated in FIG. 11, the coin-type secondary battery includes an electrode 204, a reference electrode 232, a separator 210, an electrolyte (not shown), a housing 206, and a housing 244. Besides, the coin-type secondary battery includes a ring-shaped insulator 220, a spacer 240, and a washer 242. As the electrode 204, the electrode that was obtained in the above step, in which an active material layer 202 was provided over a current collector 200, was used. The reference electrode 232 includes a reference electrode active material layer 230. In this example, the current collector was formed using a titanium foil, and the active material layer 202 was formed using the crystalline silicon layer described in Embodiment 1. In addition, the reference electrode active material layer 230 was formed using lithium metal (a lithium foil). The separator 210 was formed using polypropylene. The housing 206, the housing 244, the spacer 240, and the washer 242 each of which was made using stainless steel (SUS) were used. The housing 206 and the housing 244 have a function of making external electrical connection of the electrode 204 and the reference electrode 232.

The electrode 204, the reference electrode 232, and the separator 210 were soaked in the electrolyte. Then, as illustrated in FIG. 11, the housing 206, the electrode 204, the separator 210, the ring-shaped insulator 220, the reference electrode 232, the spacer 240, the washer 242, and the housing 244 were stacked in this order so that the housing 206 was positioned at the bottom. The housing 206 and the housing 244 were pressed and bonded to each other with a "coin cell crimper". Thus, the coin-type secondary battery was manufactured.

The electrolyte in which $LiPF_6$ was dissolved in a mixed solvent of ethylene carbonate (EC) and diethyl carbonate (DEC) was used.

(Step of Manufacturing Electrode of Comparative Secondary Battery)

Next, a step of manufacturing an electrode of the comparative secondary battery is described. A step of manufacturing an active material layer of the comparative secondary battery is different from that of the secondary battery which is one embodiment of the present invention. The other structures of the comparative secondary battery are the same as those of the secondary battery which is one embodiment of the present invention; therefore, description of structures of a substrate, a current collector, and the like is omitted.

The active material layer of the comparative secondary battery was formed using crystalline silicon.

Amorphous silicon to which phosphorus was added was deposited by a plasma CVD method over a titanium film which is the current collector, and heat treatment was performed, so that the crystalline silicon was obtained. The deposition of the amorphous silicon by the plasma CVD method was performed under the following condition: silane and 5 vol % phosphine (diluted with hydrogen) were introduced as source gases into a reaction chamber with flow rates of 60 sccm and 20 sccm, respectively; the pressure of the reaction chamber was 133 Pa; the temperature of the substrate was 280° C.; the RF power source frequency was 60 MHz; the pulse frequency of the RF power source was 20 kHz; the duty ratio of the pulse was 70%; and the power of the RF power source was 100 W. The thickness of the amorphous silicon was 3 μm.

After that, heat treatment at 700° C. was performed. The heat treatment was performed for six hours in an Ar atmosphere. By this heat treatment, the amorphous silicon was crystallized, so that a crystalline silicon layer was formed. The crystalline silicon layer obtained in the above step was used as the active material layer of the comparative secondary battery. Note that phosphorus (an impurity element imparting n-type conductivity) was added to the crystalline silicon layer. No whisker-like crystalline silicon region was formed in the crystalline silicon layer.
(Step of Manufacturing Comparative Secondary Battery)

A step of manufacturing the comparative secondary battery is described.

The active material layer was formed over the current collector in the above manner, so that the electrode of the comparative secondary battery was formed. The comparative secondary battery was manufactured using the obtained electrode. The comparative secondary battery was manufactured in a manner similar to that of the above secondary battery.
(Characteristics of Secondary Battery and Comparative Secondary Battery)

Discharge capacities of the secondary battery and the comparative secondary battery were measured using a charge-discharge measuring instrument. For the measurements of charge and discharge, a constant current mode was used, and charge and discharge were performed with a current of 2.0 mA. The upper limit voltage was 1.0 V, and the lower limit voltage was 0.03 V. All of the measurements were performed at room temperature.

Initial characteristics of the secondary battery and the comparative secondary battery are shown in Table 1. Table 1 shows initial characteristics of the discharge capacity per unit volume (mAh/cm$^3$) of the active material layers. Here, the discharge capacity (mAh/cm$^3$) was calculated under the conditions where the thickness of the active material layer of the secondary battery was 3.5 μm and the thickness of the active material layer of the comparative secondary battery was 3.0 μm.

TABLE 1

|  | Capacity (mAh/cm$^3$) |
|---|---|
| Secondary Battery | 7300 |
| Comparative Secondary Battery | 4050 |

As shown in Table 1, the discharge capacity (7300 mAh/cm$^3$) of the secondary battery is approximately 1.8 times as high as the discharge capacity (4050 mAh/cm$^3$) of the comparative secondary battery.

Thus, the actual capacity of the secondary battery is close to the theoretical capacity (9800 mAh/cm$^3$) of the secondary battery. As described above, by using the crystalline silicon layer formed by the LPCVD method as the active material layer, the secondary battery was able to have an improved capacity close to the theoretical capacity.

Example 2

In this example, an electrode included in a power storage device which is one embodiment of the present invention, and a method for manufacturing the electrode will be described with reference to FIGS. 12A and 12B.
(Step of Manufacturing Electrode)

First, a step of manufacturing the electrode is described.

An active material layer was formed over a current collector, so that the electrode for the power storage device was manufactured.

As a material of the current collector, titanium was used. As the current collector, a sheet of a titanium film (also referred to as a titanium sheet) with a thickness of 100 μm was used.

For the active material layer, crystalline silicon was used.

Over the titanium film, which is the current collector, a crystalline silicon layer serving as the active material layer was formed by an LPCVD method. The crystalline silicon layer was formed by the LPCVD method under the following conditions: silane was introduced as a source gas into a reaction chamber with a flow rate of 300 sccm; the pressure of the reaction chamber was 20 Pa; and the temperature of the reaction chamber was 590° C. The reaction chamber used was made using quartz. When the temperature of the current collector was increased, a small amount of He was introduced.
(Structure of Electrode)

Figure 12A:
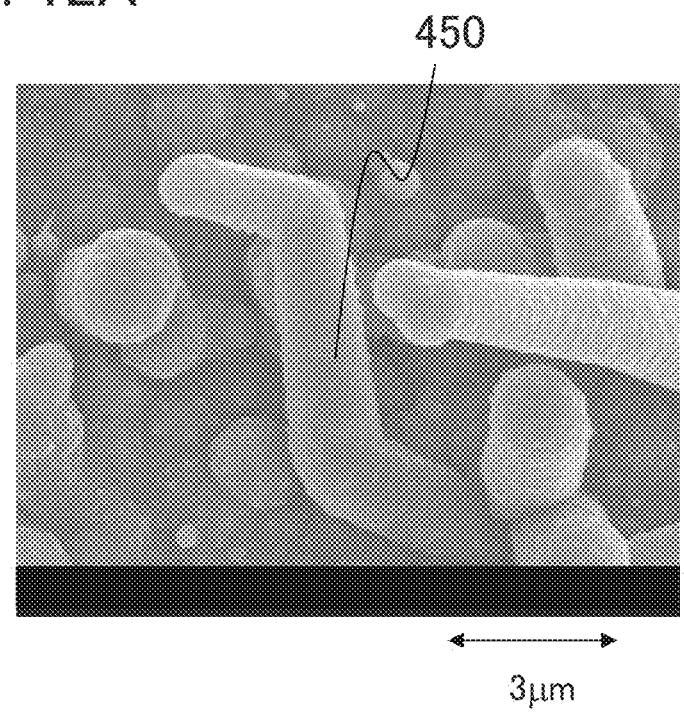
FIGS. 12A and 12B are plane SEM images of an active material layer.
Figure 12B:
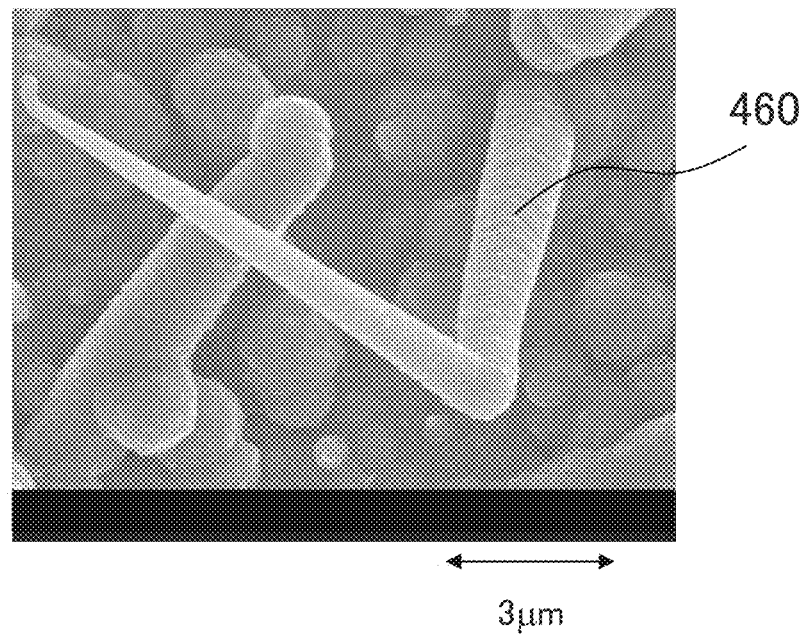

FIGS. 12A and 12B are plane scanning-electron-microscope (SEM) images of the crystalline silicon layer obtained in the above step.

As shown in FIGS. 12A and 12B, the crystalline silicon layer obtained in the above step includes a whisker-like crystalline silicon region including a columnar or needle-like protrusion.

As shown in FIG. 12A, the whisker-like crystalline silicon region includes a protrusion 450 having a bending portion. The protrusion 450 has a portion which further bends from the bending portion. In the protrusion 450, the shape of a protrusion serving as a base is similar to the shape of the bending portion. In the protrusion 450, each of the protrusion serving as the base, the bending portion, and the portion which further bends from the bending portion has a generally columnar shape.

Further, as shown in FIG. 12B, the whisker-like crystalline silicon region includes a protrusion 460 having a bending portion. In the protrusion 460, the shape of a protrusion serving as a base is different from the shape of the bending portion. In the protrusion 460, the protrusion serving as the base has a generally columnar shape, and the bending portion has a generally needle shape.

In each of the protrusion 450 and the protrusion 460 illustrated in FIGS. 12A and 12B, the direction of extension (i.e., the direction of an axis) of the bending portion is different from the direction of extension (i.e., the direction of an axis) of the protrusion serving as the base. The bending portion extends from a vicinity of a tip of the protrusion serving as the base. That is, a root of the bending portion or the portion which further bends from the bending portion (a vicinity of an interface between the bending portion or the portion which further bends from the bending portion and the protrusion serving as the base or the bending portion) exists in the vicinity of the tip of the protrusion serving as the base or the bending portion.

As shown in FIG. 12A, a surface of the protrusion included in the whisker-like crystalline silicon region is uneven.

Since the crystalline silicon layer obtained in the above step includes the whisker-like crystalline silicon region and the whisker-like crystalline silicon region includes a bending or branching portion, the surface area of the active material layer can be increased.

EXPLANATION OF REFERENCE

101: current collector, 103: active material layer, 103*a*: crystalline silicon region, 103*b*: crystalline silicon region, 105: dashed line, 107: mixed layer, 109: metal oxide layer, 111: current collector, 114*a*: protrusion, 114*b*: protrusion, 114*c*: protrusion, 115: substrate, 151: power storage device, 153: exterior member, 155: power storage cell, 157: terminal portion, 159: terminal portion, 163:

negative electrode, 165: positive electrode, 167: separator, 169: electrolyte, 171: negative electrode current collector, 173: negative electrode active material layer, 175: positive electrode current collector, 177: positive electrode active material layer, 200: current collector, 202: active material layer, 204: electrode, 206: housing, 210: separator, 220: ring-shaped insulator, 230: reference electrode active material layer, 232: reference electrode, 240: spacer, 242: washer, 244: housing, 300: automobile, 302: power storage device, 401: titanium film, 402: crystalline silicon layer, 403: space, 404: vicinity of interface, 405: layer, 411: region, 412: region, 415: region, 416: region, 441: protrusion, 450: protrusion, 460: protrusion, 600: power receiving device, 601: power receiving device portion, 602: power receiving device antenna circuit, 603: signal processing circuit, 604: secondary battery, 605: rectifier circuit, 606: modulation circuit, 607: power supply circuit, 610: power load portion, 700: power feeding device, 701: power feeding device antenna circuit, 702: signal processing circuit, 703: rectifier circuit, 704: modulation circuit, 705: demodulation circuit, 706: oscillator circuit, 1301: motorboat, 1302: power storage device, 1311: electric wheelchair, and 1312: power storage device.

This application is based on Japanese Patent Application serial no. 2010-126514 filed with Japan Patent Office on Jun. 2, 2010, the entire contents of which are hereby incorporated by reference.

What is claimed is:

1. An electrode comprising:
an active material layer comprising a first protrusion, a second protrusion and a continuous active material film;
a continuous mixed layer comprising silicon and a metal element; and
a metal oxide layer comprising the metal element and oxygen,
wherein the metal element is capable of forming silicide by reacting with silicon,
wherein each of the first protrusion and the second protrusion comprises an active material comprising silicon,
wherein the continuous active material film is in direct contact with the first protrusion and the second protrusion,
wherein the metal oxide layer is in direct contact with the continuous active material film, and
wherein the continuous mixed layer is in direct contact with the metal oxide layer.

2. The electrode according to claim 1, wherein the first protrusion comprises a bending portion or a branching portion.

3. The electrode according to claim 2, wherein the bending portion or the branching portion is in contact with the second protrusion.

4. The electrode according to claim 1, wherein the active material is silicon.

5. The electrode according to claim 1, wherein the first protrusion has a columnar shape or a needle shape.

6. The electrode according to claim 1, wherein a direction of an axis of the first protrusion is different from a direction of an axis of the second protrusion.

7. The electrode according to claim 1, wherein the continuous mixed layer comprises the silicide.

8. The electrode according to claim 1, wherein the metal element is one selected from the group consisting of zirconium, titanium, hafnium, vanadium, niobium, tantalum, chromium, molybdenum, tungsten, cobalt and nickel.

9. The electrode according to claim 1,
wherein a diameter of the first protrusion is greater than or equal to 500 nm and less than or equal to 3 µm, and
wherein a length of an axis of the first protrusion is greater than or equal to 0.5 µm and less than or equal to 1000 µm.

10. The electrode according to claim 1, wherein each of the first protrusion and the second protrusion comprises a crystalline silicon.

11. An energy storage device comprising the electrode according to claim 1.

12. An electrode comprising:
an active material layer comprising a first protrusion, a second protrusion and a continuous active material film;
a continuous mixed layer comprising silicon and a metal element; and
a metal oxide layer comprising the metal element and oxygen,
wherein the metal element is capable of forming silicide by reacting with silicon,
wherein the continuous active material film comprises silicon,
wherein a material of the continuous active material film and a material of the continuous mixed layer are different from each other,
wherein each of the first protrusion and the second protrusion comprises an active material comprising silicon,
wherein the continuous active material film is in direct contact with the first protrusion and the second protrusion,
wherein the metal oxide layer is in direct contact with the continuous active material film, and
wherein the continuous mixed layer is in direct contact with the metal oxide layer.

13. The electrode according to claim 12, wherein the first protrusion comprises a bending portion or a branching portion.

14. The electrode according to claim 13, wherein the first protrusion is in contact with the second protrusion.

15. The electrode according to claim 12, wherein the first protrusion has a columnar shape or a needle shape.

16. The electrode according to claim 12, wherein the continuous mixed layer comprises the silicide.

17. The electrode according to claim 12, wherein the metal element is one selected from the group consisting of zirconium, titanium, hafnium, vanadium, niobium, tantalum, chromium, molybdenum, tungsten, cobalt and nickel.

18. The electrode according to claim 12,
wherein a diameter of the first protrusion is greater than or equal to 500 nm and less than or equal to 3 µm, and
wherein a length of an axis of the first protrusion is greater than or equal to 0.5 µm and less than or equal to 1000 µm.

19. The electrode according to claim 12, wherein each of the first protrusion and the second protrusion comprises a crystalline silicon.

20. An energy storage device comprising the electrode according to claim 12.

* * * * *